United States Patent
Jung et al.

(10) Patent No.: US 8,971,096 B2
(45) Date of Patent: Mar. 3, 2015

(54) WIDE RANGE MULTIPORT BITCELL

(71) Applicant: QUALCOMM Incorporated, San Diego, CA (US)

(72) Inventors: Changho Jung, San Diego, CA (US); Rakesh Vattikonda, San Diego, CA (US); Nishith Desai, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/953,473

(22) Filed: Jul. 29, 2013

(65) Prior Publication Data

US 2015/0029782 A1    Jan. 29, 2015

(51) Int. Cl.
*G11C 11/00* (2006.01)
*G11C 11/419* (2006.01)

(52) U.S. Cl.
CPC .................................. *G11C 11/419* (2013.01)
USPC .................................... 365/154; 365/230.05

(58) Field of Classification Search
USPC .................... 365/154, 230.05, 156
See application file for complete search history.

(56) References Cited

U.S. PATENT DOCUMENTS

| | | | |
|---|---|---|---|
| 7,269,041 B2 * | 9/2007 | Kim et al. | 365/51 |
| 7,295,459 B2 | 11/2007 | Islam | |
| 7,577,013 B2 * | 8/2009 | Yang | 365/154 |
| 7,606,062 B2 | 10/2009 | Hsu et al. | |
| 7,890,907 B2 | 2/2011 | Kim et al. | |
| 8,395,224 B2 | 3/2013 | Becker et al. | |

FOREIGN PATENT DOCUMENTS

JP           H08273361 A       10/1996

* cited by examiner

*Primary Examiner* — Vu Le
(74) *Attorney, Agent, or Firm* — Haynes and Boone, LLP

(57) ABSTRACT

A multiport bitcell including a pair of cross-coupled inverters is provided with increased write speed and enhanced operating voltage range by the selective isolation of a first one of the cross-coupled inverters from a power supply and ground during a write operation. The write operation occurs through a write port that includes a transmission gate configured to couple a first node driven by the first cross-coupled inverter to a write bit line. A remaining second cross-coupled inverter in the bitcell is configured to drive a second node that couples to a plurality of read ports.

20 Claims, 4 Drawing Sheets

WIDE RANGE MULTIPORT BITCELL

TECHNICAL FIELD

This application relates to a multiport memory, and more particularly, to a multiport static random access memory (SRAM) with enhanced writing speed and reduced power consumption.

BACKGROUND

A static random access memory (SRAM) cell includes a pair of cross-coupled inverters for storing a bit as one of two stable logic states. Each cross-coupled inverter comprises a serial stack of a PMOS transistor and a NMOS transistor. This configuration greatly reduces static power consumption since one of the transistors in each cross-coupled inverter is always off in both logic states. Moreover, SRAM processing speed is relatively high since the cross-coupled inverters actively drive their logic states onto corresponding bit lines. In contrast, the passive capacitor in a dynamic random access memory (DRAM) cell has no such drive. DRAM processing speed is thus relatively slow compared to SRAM.

A typical single port SRAM cell (also denoted as a "bitcell") is made up of six transistors: four transistors for the pair of cross-coupled inverters, and two additional access transistors that control the access to the bitcell during read and write operations. The two access transistors are enabled by an assertion of a word line and control the connection of the bitcell to a pair of complementary bit lines used to transfer data for both read and write operations.

SRAMs with multiport memory cells further enhance operation flexibility. In a conventional multiport SRAM, additional access transistors are used to form the extra access ports. For example, FIG. 1 illustrates a conventional multiport bitcell 100 that includes cross-coupled inverters 101 and 102. Inverter 102 drives a node Q for bitcell 100 whereas inverter 101 drives a complement node QB. In this embodiment, there are two write word lines WWL0 and WWL1 corresponding to two separate write ports. Word line WWL0 drives the gates of access transistors 110 and 112 to couple node Q to a complement write bit line WBLB0 and to couple node QB to a write bit line WBL0. Similarly, word line WWL1 drives the gates of access transistors 120 and 122 to couple node Q to a complement write bit line WBLB1 and to couple node QB to a write bit line WBL1.

Read operations occur through four read ports that include read word lines RWL0, RWL1, RWL2, and RWL3 and corresponding read bit lines RBL0, RBL1, RBL2, and RBL3. Each read bit line couples to a corresponding pair of serially arranged read access transistors. One read access transistor in each pair has its gate driven by the corresponding read word line. Depending upon the read port, another read access transistor has its gate driven by Q node or the QB node. For example, read word line RWL0 drives the gate of a read access transistor 130 that is serially coupled between bit line RBL0 and a read access transistor 135 having its gate driven by the Q node. The source of read access transistor 135 couples to ground. Should read word line RWL0 be asserted, the voltage on read bit line RBL0 after its precharging will depend upon the logic state of node Q. If the Q node was charged to a power supply voltage VDD, then read access transistors 130 and 135 will both be on such that read bit line RBL0 discharges towards ground. Conversely, if the Q node was discharged, then read access transistor 135 is switched off such that read bit line RBL0 can maintain its charge. In this fashion, a sense amplifier (not illustrated) coupled to read bit line RBL0 can determine the logical state of the Q node based upon whether read bit line RBL0 is discharged towards ground or floats. The reading of the logical state of the Q node (or the QB node) occurs analogously with regard to the remaining read bit lines RBL1, RBL2, and RBL3.

In a write operation for one of the write ports, the corresponding write bit line is either charged to the power supply voltage VDD or grounded depending upon the logical value to be written into bitcell 100 whereas the corresponding complement write bit line is charged or discharged in a complementary fashion. For example, a binary one may correspond to charging a write bit line to VDD and discharging the corresponding complement write bit line to ground (VSS). In such an embodiment, a binary zero would then correspond to charging the complement bit line to VDD and grounding the bit line. But note the issue that occurs if a write operation needs to change the stored value in bitcell 100. For example, suppose the stored logic state for bitcell 100 is such that the QB node is charged to VDD whereas the Q node is discharged to VSS. In such a state, the PMOS transistor (not illustrated) in inverter 101 is fully on—it is this transistor that is charging the QB node to VDD. Suppose a write operation is then initiated by asserting write word line WWL0. Access transistor 110 will then couple the QB node to write bit line WBL0 while access transistor 112 couples the Q node to a complement write bit line WBLB0. If the data value to be written is such that write bit line WBL0 is grounded whereas complement write bit line WBLB0 is charged to VDD, the logic states for the nodes QB and Q must be "flipped" such that node QB becomes grounded and node Q is charged to VDD. But that means NMOS access transistor 110 must fight with the PMOS transistor in inverter 101 at the onset of the write operation since NMOS access transistor 110 is trying to pull the QB node low by discharging it to the grounded bit line WBL0 whereas the inverter's PMOS transistor is trying to pull the QB node high.

To complete the write operation by flipping the stored logic state, an NMOS access transistor such as transistor 110 must be relatively strong in relation to the inverter's PMOS transistor. But as semiconductor process technology pushes into the deep submicron regime, a PMOS transistor tends to be stronger than a corresponding NMOS transistor of the same size. It is thus more and more difficult for an access transistor to flip the stored logic state of a bitcell as transistor dimensions are reduced. The power supply voltage VDD must be held relatively high and the write operation duration must have a sufficient length so that the NMOS transistor has the drive to overcome the inverter's PMOS transistor. To increase write operation speed, various write assist schemes have been developed that add complexity and decrease circuit density. Moreover, the required level for the operating voltage increases power consumption Accordingly, there is a need in the art for multiport SRAM cells having improved write speed with reduced power consumption and improved layout.

SUMMARY

A multiport bitcell is provided that includes a pair of cross-coupled inverters. A first cross-coupled inverter in the pair drives a first node for the bitcell. Similarly, a remaining second cross-coupled inverter in the pair drives a second node for the bitcell in a complementary fashion to the driving of the first node. A write port for the bitcell is configured to couple a write bit line to the first node through a transmission gate during a write operation on the write port. The first cross-coupled inverter is selectively isolated from a power supply and from ground during the write operation. The bitcell includes a plurality of read ports that couple to the second node.

DETAILED DESCRIPTION

Figure 1:
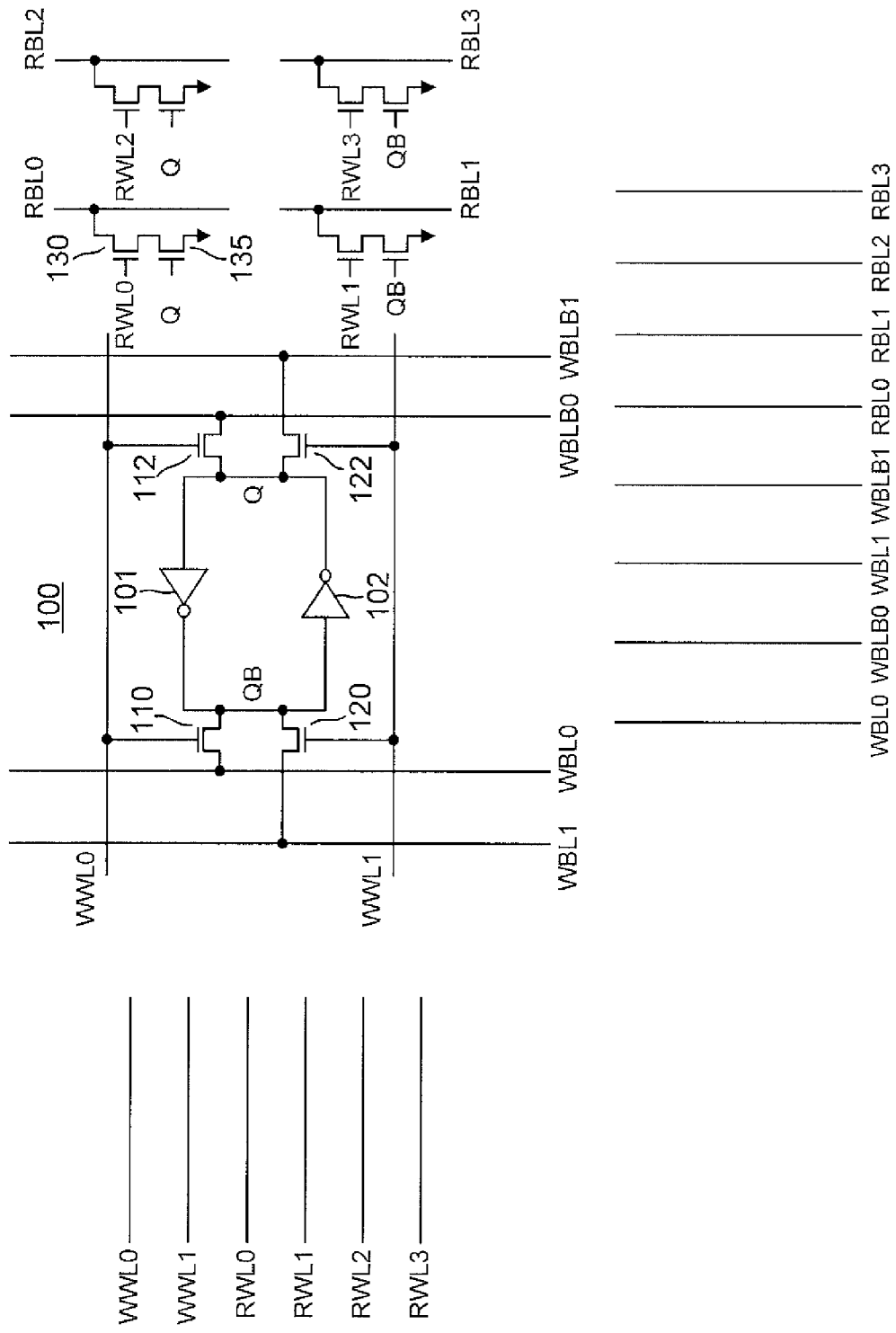
FIG. 1 is a circuit diagram of a conventional multiport bitcell having two write ports and four read ports.

A multiport bitcell (memory cell) is provided that achieves faster write times by selectively isolating a first cross-coupled inverter in the bitcell from its power supply and ground nodes during a write operation. Because of the faster write times, a write port for the bitcell may be time multiplexed during a write clock cycle so as to simulate two separate write ports. A first cross-coupled inverter in the bitcell drives a first node that couples through a transmission gate to a write bit line in the write port. A remaining second cross-coupled inverter in the bitcell drives a second node that couples to a plurality of read ports. In one embodiment, the first node is a complement QB node whereas the second node is a Q node.

Overview

The first cross-coupled inverter couples to a power supply through a power switch such as a PMOS transistor that has its gate controlled by a write word line. Similarly, the first cross-coupled inverter couples to ground through a ground switch such as an NMOS transistor having its gate controlled by a complement word line. The write word line drives a gate of an NMOS transistor in the transmission gate whereas the complement write word line drives a gate of PMOS transistor in the transmission gate. During a write operation, the write word line is asserted (raised to the power supply voltage VDD), which turns off the PMOS power switch transistor and isolates the first cross-coupled inverter from the power supply. The assertion of the write word line also turns on the NMOS transistor in the transmission gate. At substantially the same time, the complement write word line is asserted by being brought low (grounded) so that the NMOS ground switch transistor turns off and isolates the first cross-coupled inverter from ground. The low state on the complement word line turns on the PMOS transistor in the transmission gate during the write operation.

The first cross-coupled inverter comprises a serial stack of a PMOS transistor and an NMOS transistor. In one logic state for the bitcell, the PMOS transistor in the first cross-coupled inverter pulls the first node high (to VDD). Conversely, in a complementary logic state for the bitcell, the NMOS transistor in the first cross-coupled inverter pulls the first node low (to ground). But the isolation of the first cross-coupled inverter through the power switch and ground switch reduces the write operation time regardless of the previous logic state for the bitcell—during a write operation, the first cross-coupled inverter's PMOS transistor cannot pull the first node high nor can the first cross-coupled inverter's NMOS transistor pull the first node low. The write operation speed is thus greatly enhanced as compared to a conventional bitcell such as bitcell 100. In this fashion, the write port may be time multiplexed during a write clock cycle so that the write port simulates two write ports. During a first half of a write clock cycle, the write port may be driven with a data input on the write bit line so as to simulate a first write port. Alternatively, during a second half of the write clock cycle, the write port may be driven with a data input on the write bit line so as to simulate a second write port.

Not only is write operation speed enhanced, the power supply voltage VDD may be reduced as well. For example, the minimum value of VDD for conventional bitcell 100 may be as high as 0.8 V. If the power supply voltage were reduced below this minimum level, an access transistor such as transistor 110 may not have sufficient strength to "flip" the logic state stored in bitcell 100 during a write operation. But the selective isolation of the first cross-coupled inverter as discussed herein means that the transmission gate never struggles with the first cross-coupled inverter even if the data input coupled through the transmission gate is the complement of the first node's logic state prior to the write operation. The minimum supply voltage (VDDmin) for the multiport bitcell disclosed herein may thus be reduced to, for example, 0.4 V. This reduction in the power supply voltage sharply reduces power consumption. Yet this reduction in power consumption is achieved with the same layout density (if not better than) the density for conventional multiport bitcells. These features and advantages may be better understood with regard to the following example embodiments.

Example Embodiments

Figure 2:
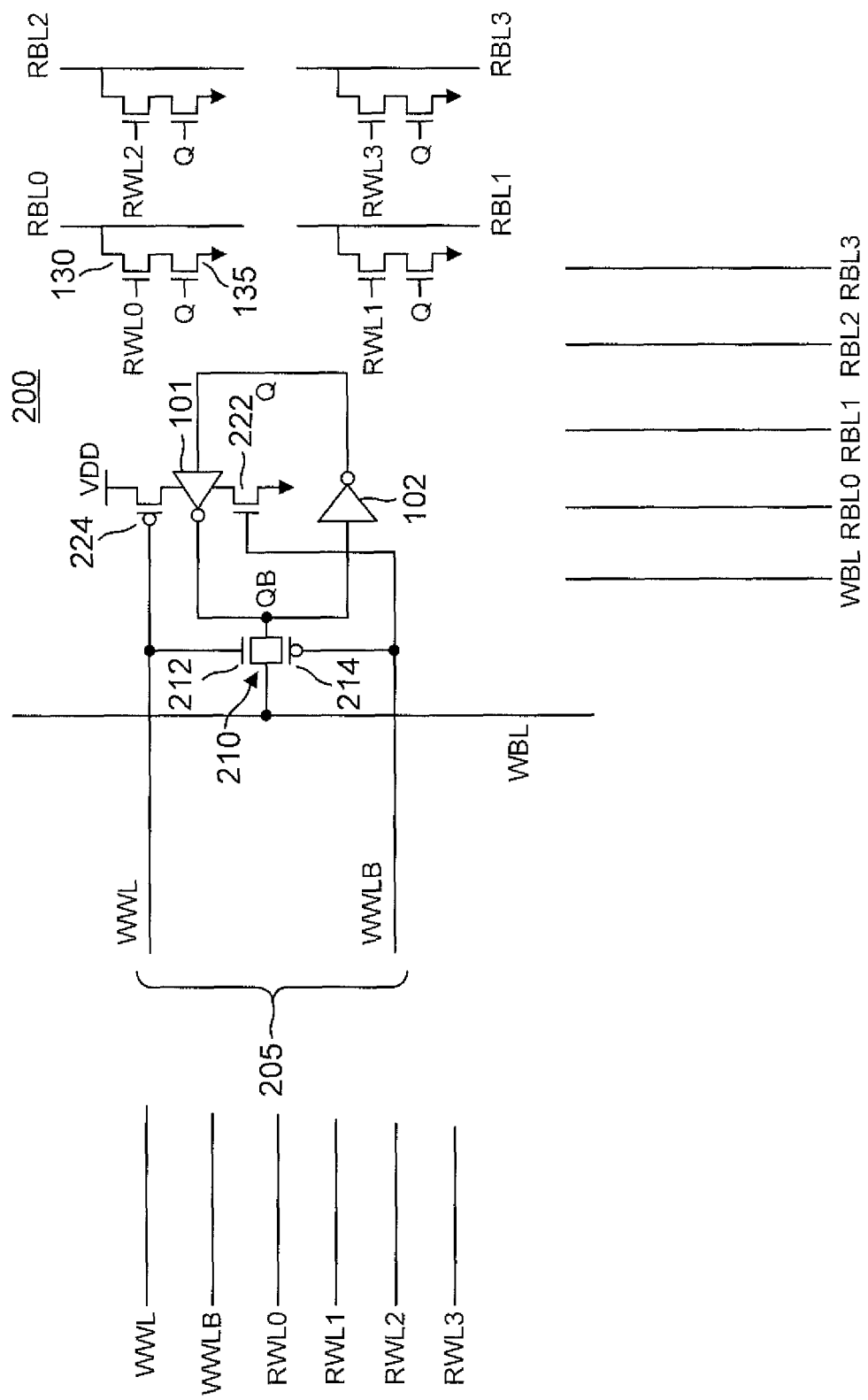
FIG. 2 is a circuit diagram of a multiport bitcell including a transmission gate and a selectively isolated cross-coupled inverter.

An example multiport bitcell 200 is shown in FIG. 2. As discussed with regard to conventional bitcell 100, bitcell 200 includes a pair of cross-coupled inverters 101 and 102, each comprising a serially-connected stack (not illustrated) of a PMOS transistor and an NMOS transistor. Inverter 101 drives a complement QB node whereas inverter 102 drives a Q node for bitcell 200. In this embodiment, inverter 101 comprises the first cross-coupled inverter discussed above such that the QB node comprises the first node. A write port 205 couples to the QB node through a transmission gate 210. Write port 205 includes a write word line WWL and a complement write word line WWLB. The write word line WWL drives the gate of an NMOS transistor 212 in transmission gate 210 whereas the complement write word line WWLB drives the gate of a PMOS transistor 214 in transmission gate 210.

In a write operation, the write word line WWL is asserted by being brought high (charged to VDD), which causes NMOS transistor 212 to turn on. The complement write word line WWLB is asserted at the same time by being grounded (discharged to VSS), which causes PMOS transistor 214 to turn on. Depending upon the input data to be written into bitcell 200, a write bit line (WBL) is charged accordingly (either charged to VDD or discharged to VSS). This voltage state of the write bit line couples through transmission gate 210 to the QB node when the write word line and the complement write word line are asserted. As known in the transistor arts, PMOS transistor 214 in transmission gate 210 passes a strong one (VDD) whereas NMOS transistor 212 passes a strong zero (VSS). Thus, regardless of whether the write bit line WBL is asserted high to VDD or pulled low to VSS depending upon what logical value is to be written into bitcell 200, transmission gate 210 will drive the QB node responsive to the write bit line voltage.

To increase the write speed time, first cross-coupled inverter 101 couples to the power supply VDD through a PMOS power switch transistor 224 that has its gate driven by the write word line. The assertion of the write word line thus turns off transistor 224 during a write operation and isolates first cross-coupled inverter 101 from the power supply voltage while the write word line is asserted. PMOS transistor 224 thus comprises a means for isolating first cross-coupled inverter 102 from the power supply. This isolation is quite advantageous should the QB node be charged to VDD but must then be discharged in a write operation. In that case, NMOS transistor 212 in transmission gate 210 discharges the QB node to the grounded write bit line. Prior to the write operation, the PMOS transistor (not illustrated) in first cross-coupled inverter 101 was conducting so as to pull the QB node high to VDD. But this PMOS transistor cannot fight with NMOS transistor 212 as it discharges the QB node because of the isolation from the power supply node during the write operation as performed by PMOS power switch transistor 224.

Similarly, should the QB node be discharged to VSS but a write operation needs to raise it to VDD, the NMOS transistor (not illustrated) in first cross-coupled inverter 101 would be conducting prior to the write operation. PMOS transistor 214 in transmission gate 210 need not fight with this NMOS transistor because NMOS ground switch transistor 222 is switched off during the write operation in response to the assertion of the complement write word line. The NMOS transistor in first cross-coupled inverter 101 can then no longer discharge the QB node to ground while the complement write word line is asserted. NMOS transistor 222 thus comprises a means for isolating first cross-coupled inverter from ground during a write operation. Because of this isolation, PMOS transistor 214 can thus quickly charge the QB node to VDD. In this fashion, write speeds are increased regardless of whether a logic high or logic low value is being written into the QB node. The isolation of first cross-coupled inverter 101 during a write operation also increases the operating voltage range as discussed above such that reduced levels for VDD may be utilized. This reduction in VDD sharply reduces power consumption and is thus quite advantageous for battery-powered devices such as cellular telephones.

Because of this increased writing speed, the single write port 205 may be time multiplexed during a write clock cycle so as to simulate two separate write ports. For example, one simulated write port may be designated as port [0] whereas a remaining simulated write port may be designated as port [1]. The write operations for port [0] may then take place during one half of the write clock cycle (for example, the first half). The write operations for port [1] then occur in the second half of the write clock cycle. In this fashion, dual write port operation is achieved using single write port 205. It will be appreciated, however, that both write port [0] and write port [1] cannot be accessed for a given bitcell in one write clock cycle.

In bitcell 200, the write access occurs only at the QB node but in alternative embodiments, the write access could occur only at the Q node. It is desirable to have the node that is accessed in the write operation have as little capacitance as practical to assist in rapid write operation speed. Thus, the read ports in bitcell 200 couple only to the node that is not written to (in this embodiment, the Q node). Bitcell 200 has four read ports corresponding to read word lines RWL0, RWL1, RWL2, and RWL3 and corresponding read bit lines RBL0, RBL1, RBL2, and RBL3. The read ports for read bit lines RBL0 and RBL2 operate as discussed with regard to bitcell 100. For example, a read word line RWL0 drives a gate of read access transistor 130 that is serially coupled between bit line RBL0 and read access transistor 135 having its gate driven by the Q node. The source of read access transistor 135 couples to ground. Should read word line RBL0 be asserted, the voltage on read bit line RBL0 will depend upon the logic state of the Q node. If the Q node is charged to VDD, then read access transistors 130 and 135 will both be on such that read bit line RBL0 discharges towards ground. Conversely, if the Q node is discharged to VSS, then read access transistor 135 is switched off such that read bit line RBL0 can maintain its charge. In this fashion, a sense amplifier (not illustrated) coupled to read bit line RBL0 can determine the logical state of the Q node based upon whether read bit line RBL0 is discharged towards ground or floats.

A read operation on the read ports for read word lines RWL1 and RWL3 in bitcell 200 is analogous to that just described for read word line RWL0 in that each of the read ports for read word lines RWL1 and RWL3 includes a read access transistor controlled by the Q node. In contrast, conventional bitcell 100 had the analogous read access transistors for these read ports controlled by the QB node to equalize the capacitive loading between the Q and QB nodes. This was necessary in bitcell 100 because both the Q and QB nodes were accessed in a write operation. But transmission gate 210 couples only to node QB so that the capacitive loading for the read ports may all be shifted to the Q node.

The density of bitcell 200 is the same as bitcell 100 in that each comprises sixteen transistors. Both bitcells have six word lines but the number of bit lines differs. Bitcell 200 uses only 5 bit lines whereas bitcell 100 requires 8 bit lines. The layout complexity for bitcell 200 is thus reduced as compared to bitcell 100 yet it achieves faster write operation speeds, increased operating voltage range, and reduced power consumption.

Although writing operation speed is increased, a user may require the simulation of four write ports rather than just two write ports. In general, that would be possible for bitcell 200 if the write clock frequency were sufficiently slow. For example, two write ports could then be sequentially accessed during a first half of a write clock cycle and then another two ports could be sequentially accessed during a second half of a write clock cycle. But this time multiplexing of four write ports into one clock write clock cycle becomes problematic as the write clock frequency is increased to, for example, 1 GHz or higher. At these higher clock frequencies, two separate write ports may be necessary with each write port operating as discussed with regard to bitcell 200 so that four write ports (two for each separate write port) may be simulated.

Figure 3:
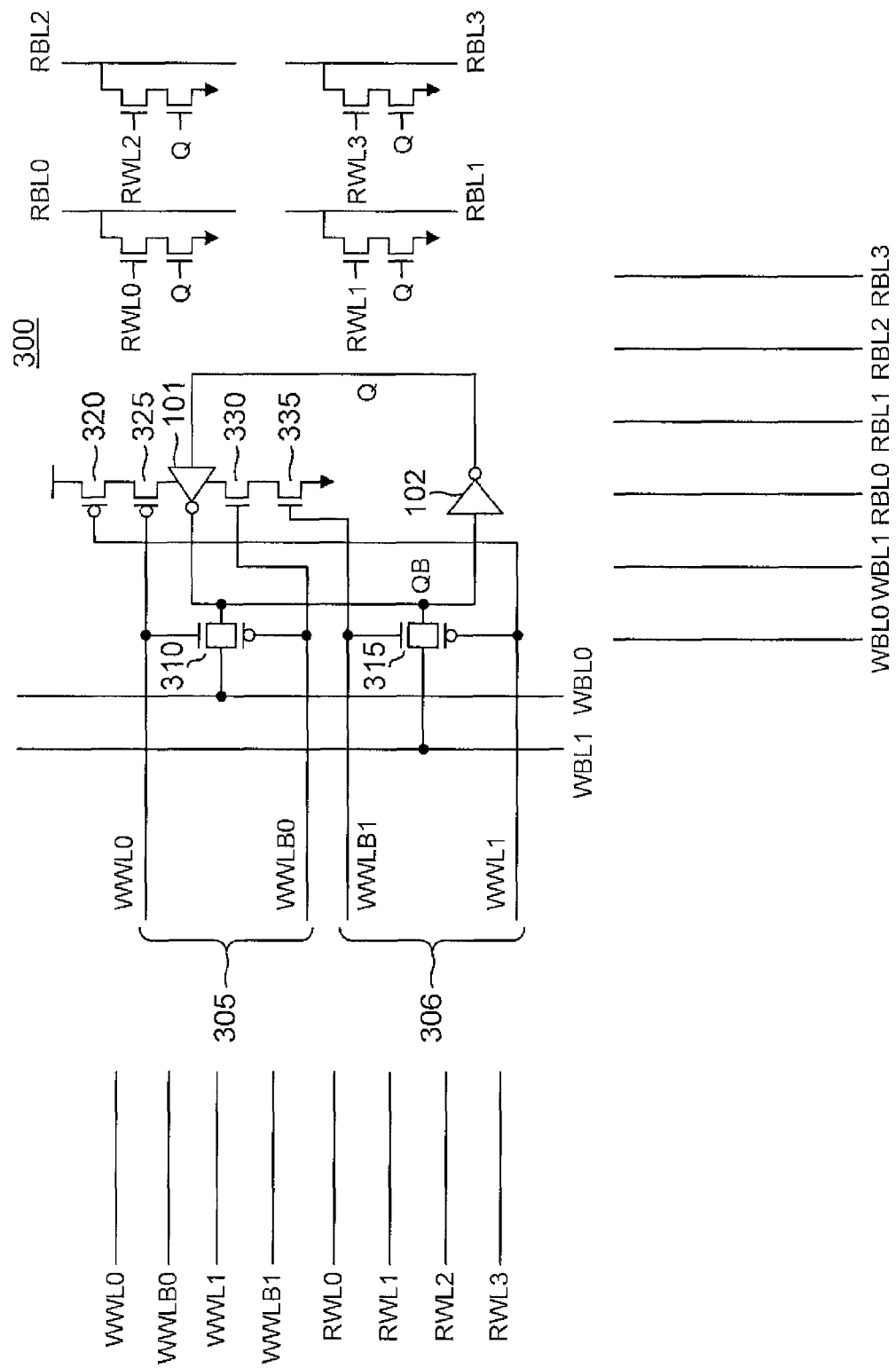
FIG. 3 is a circuit diagram of a multiport bit cell including a pair of transmission gates and a selectively isolated cross-coupled inverter.

An example dual write port bitcell 300 is shown in FIG. 3 that enables the simulation of four write ports. Bitcell 300 includes a write port 305 and a write port 306. Each port 305 and 306 is analogous to write port 205 discussed with regard to bitcell 200. Write port 305 includes a write word line WWL0 and a complement write word line WWLB0 that control a transmission gate 310 so as to couple a write bit line WBL0 to the QB node for bitcell 300. Write word line WWL0 controls the gate of a PMOS power switch transistor 325 to isolate first cross-coupled inverter 101 from the power supply VDD when write word line WWL0 is asserted high during a write operation on write port 305. Complement write word line WWLB0 controls the gate of an NMOS ground switch transistor 330 to isolate first cross-coupled inverter 101 from ground when complement write word line WWLB0 is asserted low during a write operation on write port 305.

Write port 306 is analogous to write port 305 in that it includes a write word line WWL1 and a complement write word line WWL1B that control a transmission gate 315 to couple the QB node to a write bit line WBL1 during a write operation on write port 306. Write word line WWL1 controls the gate of a PMOS power switch transistor 320 coupled between the power supply and PMOS power switch transistor 325 to isolate first cross-coupled inverter 101 from the power supply when write word line WWL1 is asserted high during a write operation on write port 306. Complement write word line WWLB1 controls the gate of an NMOS ground switch transistor 335 coupled between ground and NMOS ground switch transistor 330 to isolate first cross-coupled inverter 101 from ground when complement write word line WWLB1 is asserted low during a write operation on write port 305.

The four read ports corresponding to read bit lines RBL0, RBL1, RBL2, and RBL3 as well as to read word lines RWL0, RWL1, RWL2, and RWL3 operate as discussed with regard to bitcell 200. Each write port 305 and 306 may be time multiplexed so as to each simulate two separate write ports analogously as discussed with regard to write port 205. For example, in the first half of a first write clock cycle, write port 305 may be accessed as a first write port or accessed as a second write port in the second half of the first write clock cycle. Similarly, in the first half of a second write clock cycle, write port 306 may be accessed as a third write port or accessed as a fourth write port in the second half of the second write clock cycle. The accessing of the first and second write ports may thus be time multiplexed with the access to the third and fourth write ports in alternating write clock cycles in this fashion.

The height of bitcell 300 is determined by its total number of word lines, which is eight in this embodiment. If conventional bitcell 100 were modified to have another two write ports, it would also require eight word lines. The density would be the same as well as both bitcell 300 and a conventional 4 write port/4 read port bitcell each includes twenty transistors. But the power consumption for bitcell 300 would be greatly reduced in comparison to a conventional bitcell as discussed analogously with regard to bitcell 200. An example method of operation for a multiport bitcell will now be discussed.

Example Methods of Operation

Figure 4:
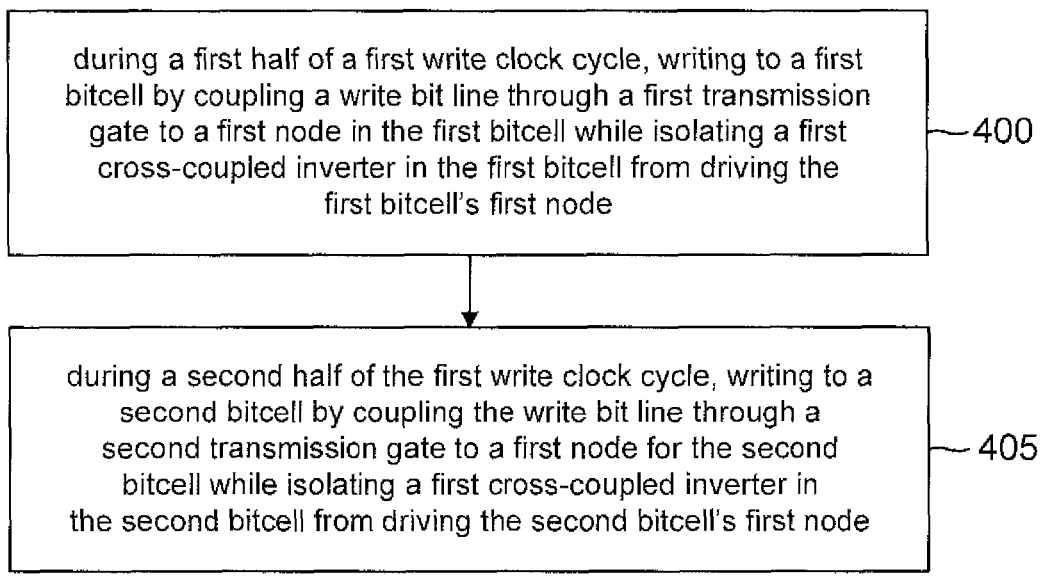
FIG. 4 is a flowchart for an example method of writing to a bitcell according to an embodiment of the present disclosure.

A flowchart for an example method of operation for a multiport memory including a plurality of bitcells such as bitcells 200 is shown in FIG. 4. The write bit line WBL of FIG. 2 extends across a column of bitcells (not illustrated), with each bitcell being in its own row. Although each bitcell includes a write port such as write port 205 that may be time multiplexed during a single write clock cycle to accommodate the write operations for two simulated write ports, the simulated write ports are not accessed in the same row during the same write clock cycle to prevent write port conflicts. For example, suppose a first bitcell such as bitcell 200 of FIG. 2 is located in one row for the multipart memory and that a second bitcell similar to bitcell 200 is located in another row but in the same column. Each of these bitcells has a write port that may be accessed as a simulated first write port and also as a simulated second write port. This access is time multiplexed as discussed earlier such that the simulated first write ports are accessed during one half of a write clock cycle and such that the simulated second write ports are accessed during a remaining half of a write clock cycle.

The example method of operation thus includes a step 400 that comprises, during the first half of a first write clock cycle, writing to a first bitcell by coupling a write bit line through a first transmission gate to a first node in the first bitcell while isolating a first cross-coupled inverter in the first bitcell from driving the first bitcell's first node. The method also includes a step 405 that comprises, during a second half of the first write cycle, writing to a second bitcell by coupling the write bit line through a second transmission date to a first node for the second bitcell while isolating a first cross-coupled inverter in the second bitcell from driving the second bitcell's first node. In this fashion, the same write bit line writes to both the first and second bitcells in one write clock cycle but through different simulated write ports and in different halves of the write clock cycle.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit for a memory cell, comprising:
a pair of cross-coupled inverters, wherein a first inverter in the pair is configured to drive a first node for the memory cell and a remaining second inverter in the pair is configured to drive a second node for the memory cell;
a plurality of read ports configured to access the second node;
a first write port including a write word line, a complement write word line, and a write bit line;
a first transmission gate configured to couple the first node to the write bit line responsive to an assertion of the write word line and the complement write word line; and
a power switch configured to isolate the first inverter from a power supply responsive to the assertion of the write word line.

2. The circuit of claim 1, further comprising a ground switch configured to isolate the first inverter from ground responsive to the assertion of the complement write word line.

3. The circuit of claim 2, wherein the power switch comprises a PMOS transistor, and wherein the ground switch comprises an NMOS transistor.

4. The circuit of claim 1, further comprising:
a second write port including a second write word line, a second complement write word line, and a second write bit line;
a second transmission gate configured to couple the first node to the second write bit line responsive to an assertion of the second write word line and the second complement write word line; and
a second power switch configured to isolate the first inverter from the power supply responsive to the assertion of the second write word line.

5. The circuit of claim 4, further comprising a second ground switch configured to isolate the first inverter from ground responsive to the assertion of the second complement write word line.

6. The circuit of claim 5, wherein the second power switch comprises a PMOS transistor, and wherein the second ground switch comprises an NMOS transistor.

7. The circuit of claim 1, wherein each read port includes a read word line, a read bit line, and a pair of read access transistors coupled to the read word line and the read bit line.

8. A method of writing to a dual write port memory, comprising
during a first half of a first write clock cycle, writing to a first bitcell by coupling a write bit line through a first transmission gate to a first node in the first bitcell while isolating a first cross-coupled inverter in the first bitcell from driving the first bitcell's first node; and during a second half of the first write clock cycle, writing to a second bitcell by coupling the write bit line through a second transmission gate to a first node for the second bitcell while isolating a first cross-coupled inverter in the second bitcell from driving the second bitcell's first node.

9. The method of claim 8, further comprising:

during a first half of a second write clock cycle, writing to the second bitcell by coupling the write bit line through the second transmission gate to the second bitcell's first node while isolating the first cross-coupled inverter in the second bitcell from driving the second bitcell's first node; and during a second half of the second write clock cycle, writing to the first bitcell by coupling the write bit line through the first transmission gate to the first bitcell's first node while isolating the first cross-coupled inverter in the first bitcell from driving the first bitcell's first node.

10. The method of claim 8, wherein isolating the first cross-coupled inverter in the first bitcell is responsive to turning off a power switch configured to couple the first cross-coupled inverter in the first bitcell to a power supply.

11. The method of claim 10, wherein isolating the first cross-coupled inverter in the first bitcell is further responsive to turning off a ground switch configured to couple the first cross-coupled inverter in the first bitcell to ground.

12. The method of claim 8, further comprising:

accessing one of a plurality of read ports for the first bitcell by asserting a read word line for the accessed read port so that a precharged read bit line for the accessed read port discharges or retains charge depending upon a logic state for a second node in the first bitcell.

13. The method of claim 10, wherein turning off the power switch comprises turning off a PMOS power switch transistor.

14. The method of claim 8, wherein coupling the first bitcell's first node to the write bit line through the first transmission gate comprises asserting a write word line by charging the write word line to a power supply voltage VDD, and further comprises asserting a complement write word line by discharging the complement write word line to ground.

15. The method of claim 14, wherein asserting the write word line turns on an NMOS transistor in the first transmission gate and wherein asserting the complement write word line turns on a PMOS transistor in the first transmission gate.

16. The method of claim 8, wherein the first and second bitcells comprise SRAM bitcells.

17. A static random access memory (SRAM) cell, comprising:

a pair of cross-coupled inverters, wherein a first cross-coupled inverter in the pair is configured to drive a first node for the SRAM cell and a remaining second cross-coupled inverter in the pair is configured to drive a second node for the SRAM cell;

a plurality of read ports configured to access the second node;

a first write port including a write word line, a complement write word line, and a write bit line;

a first transmission gate configured to couple the first node to the write bit line responsive to an assertion of the write word line and the complement write word line; and means for isolating the first cross-coupled inverter from a power supply responsive to the assertion of the write word line and for isolating the first inverter from ground responsive to the assertion of the complement write word line.

18. The SRAM cell of claim 17, wherein the means comprises a PMOS power switch transistor coupled between the first cross-coupled inverter and the power supply.

19. The SRAM cell of claim 17, wherein the plurality of read ports comprises four read ports.

20. The SRAM cell of claim 18, wherein the means further comprises an NMOS ground switch transistor coupled between the first cross-coupled inverter and ground.

* * * * *